(12) United States Patent
Kawajiri et al.

(10) Patent No.: US 10,884,083 B2
(45) Date of Patent: Jan. 5, 2021

(54) GRADIENT MAGNETIC FIELD POWER SUPPLY AND MAGNETIC RESONANCE IMAGING APPARATUS

(71) Applicant: CANON MEDICAL SYSTEMS CORPORATION, Otawara (JP)

(72) Inventors: Sho Kawajiri, Nasushiobara (JP); Norio Togawa, Nasushiobara (JP); Kazuhiro Hamaya, Kodaira (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 108 days.

(21) Appl. No.: 16/207,372

(22) Filed: Dec. 3, 2018

(65) Prior Publication Data

US 2019/0170841 A1    Jun. 6, 2019

(30) Foreign Application Priority Data

Dec. 6, 2017    (JP) .................... 2017-234505

(51) Int. Cl.
*G01R 31/00*    (2006.01)
*G01R 33/385*    (2006.01)
*G01R 19/00*    (2006.01)
*G01R 15/20*    (2006.01)

(52) U.S. Cl.
CPC ....... *G01R 33/3852* (2013.01); *G01R 15/202* (2013.01); *G01R 19/0092* (2013.01)

(58) Field of Classification Search
USPC .......... 32/228, 232, 322, 331, 345; 324/228, 324/232, 322, 331, 345
See application file for complete search history.

(56) References Cited

U.S. PATENT DOCUMENTS

| | | | |
|---|---|---|---|
| 8,203,342 B2* | 6/2012 | Ochi | G01R 33/34076 324/318 |
| 2014/0070809 A1* | 3/2014 | Imamura | G01R 33/36 324/319 |
| 2019/0097519 A1* | 3/2019 | Yamakawa | H02M 7/537 |

FOREIGN PATENT DOCUMENTS

JP    2005-27700    2/2005

* cited by examiner

*Primary Examiner* — Vincent Q Nguyen
(74) *Attorney, Agent, or Firm* — Obion, McClelland, Maier & Neustadt, L.L.P.

(57) ABSTRACT

A gradient magnetic field power supply, connected to a first coil and a second coil for each applying a gradient magnetic field to an object, the power supply, according to an embodiment includes a first current sensor and a second current sensor. The second current sensor is provided such that a direction of a current detectable by the second current sensor crosses a direction of a current detectable by the first current sensor.

11 Claims, 8 Drawing Sheets

GRADIENT MAGNETIC FIELD POWER SUPPLY AND MAGNETIC RESONANCE IMAGING APPARATUS

CROSS-REFERENCE TO RELATED APPLICATION

This application is based upon and claims the benefit of priority from Japanese Patent Application No. 2017-234505, filed on Dec. 6, 2017, the entire contents of which are incorporated herein by reference.

FIELD

An embodiment as an aspect of the present invention relates to a gradient magnetic field power supply and a magnetic resonance imaging (MRI) apparatus.

BACKGROUND

The MRI apparatus performs an imaging of an object placed on a table, and acquires internal data of the object as image data.

The MRI apparatus includes a gradient magnetic field coil, a transmission coil, such as a whole body (WB) coil, for transmitting high frequency pulses, that is, radio frequency (RF) pulses. The WB coil receives RF pulse signals from an RF transmitter, and excites atomic nuclear spins of an imaging region placed in the static magnetic field with high frequency pulses of Larmor frequency, that is, the RF pulses. Then, the MRI apparatus receives magnetic resonance signals, that is, MR signals generated from the imaging region with the excitation by a reception coil, for example a local coil, and generates the image data based on the MR signals.

The MRI apparatus includes a gradient magnetic field power supply which supplies current to the gradient magnetic field coil based on a pulse sequence. The gradient magnetic field power supply includes a current sensor which measures a current value by detecting a magnetic flux generated by a current flowing through a part of a cable, the cable supplying an electric current to each coil constituting the gradient magnetic field coil.

DETAILED DESCRIPTION

A gradient magnetic field power supply and an MRI apparatus according to an embodiment will be described by referring to the accompanying drawings.

A gradient magnetic field power supply according to an embodiment, connected to a first coil and a second coil for each applying a gradient magnetic field to an object, includes: a first amplifier and a second amplifier corresponding to the first coil and the second coil, respectively; a first cable connecting the first coil and the first amplifier; a second cable connecting the second coil and the second amplifier, the second cable being provided adjacent to the first cable; a first current sensor installed on the first cable and configured to measure a current value flowing through the first cable; and a second current sensor installed on the second cable and configured to measure a current value flowing through the second cable. The second current sensor is provided such that a direction of a current detectable by the second current sensor crosses a direction of a current detectable by the first current sensor.

Figure 1:
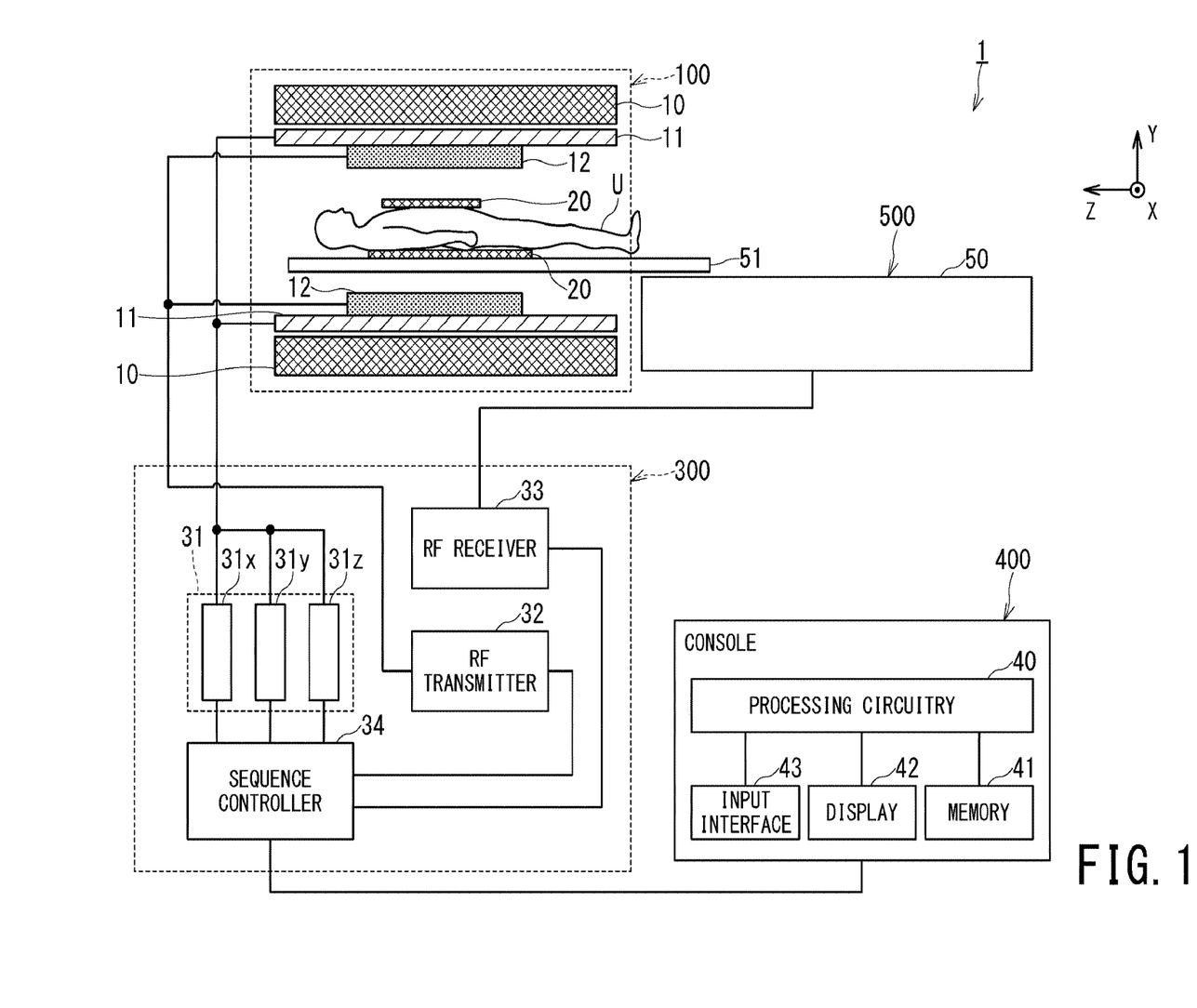
FIG. 1 is a schematic diagram showing entire constitution of an MRI apparatus according to an embodiment.

FIG. 1 is a schematic diagram showing entire constitution of an MRI apparatus 1 according to an embodiment.

FIG. 1 shows an MRI apparatus 1 according to the embodiment. The MRI apparatus 1 includes a magnet rack 100, a control cabinet 300, a console 400, and a bed 500. The magnet rack 100, the control cabinet 300, and the bed 500 are generally provided in an examination room. The examination room is also called the imaging room. The console 400 is provided in a control room. The control room is also called an operation room.

The magnet rack 100 has a static magnetic field magnet 10, a gradient magnetic field coil 11, and a WB coil 12. These components are accommodated in a housing having cylindrical shape. The bed 500 has a bed body 50 and a table 51.

The control cabinet 300 includes a gradient magnetic field power supply 31 (for X-axis 31x, for Y-axis 31y, and for Z-axis 31z), an RF transmitter 32, an RF receiver 33, and a sequence controller 34.

The console 400 includes processing circuitry 40, a memory 41, a display 42, and an input interface 43. The console 400 functions as a host computer.

The static magnetic field magnet 10 of the magnet rack 100 is roughly divided into a tunnel type and an open type. In the tunnel type, the magnet has a cylindrical magnet structure. In the open type, a pair of magnets is arranged above and below the imaging space. In the embodiment, the case where the static magnetic field magnet 10 is the tunnel type will be described, but the present invention is not limited to that case.

The static magnetic field magnet 10 has a shape which is substantially cylindrical and generates a static magnetic field in a bore into which an object or a patient U, for example, is conveyed. The bore is a space inside a cylinder of the magnet rack 100. The static magnetic field magnet 10 is, for example, composed of: a casing for holding liquid helium; a refrigerator for cooling the liquid helium to an extremely low temperature; and a superconducting coil inside the casing. It should be noted that the static magnetic field magnet 10 may be constituted by a normal conductive magnet or a permanent magnet. Hereinafter, the case where the static magnetic field magnet 10 has the superconducting coil will be described.

The static magnetic field magnet 10 incorporates the superconductive coil, and the superconductive coil is cooled to the extremely low temperature by the liquid helium. The static magnetic field magnet 10 generates a static magnetic field by applying a current supplied from a power supply device for the static magnetic field in an excitation mode to the superconductive coil. After that, when the mode changes to a permanent current mode, the power supply device for the static magnetic field is separated. Once the mode has changed to the permanent current mode, the static magnetic field magnet 10 continues to generate the static magnetic field over a long period of time, for 1 year or more, for example.

The gradient magnetic field coil 11 has a shape which is substantially cylindrical similarly to the static magnetic field magnet 10 and is installed inside the static magnetic field magnet 10. The gradient magnetic field coil 11 applies a gradient magnetic field to the patient U by electric power supplied from the gradient magnetic field power supply 31. The gradient magnetic field coil 11 includes an X-ch coil 11$x$(shown in FIG. 2) for generating a gradient magnetic field in the X-axis direction, a Y-ch coil 11$y$(shown in FIG. 2) for generating a gradient magnetic field in the Y-axis direction, and a Z-ch coil 11$z$(shown in FIG. 2) for generating a gradient magnetic field in the Z-axis direction.

In this embodiment, since an eddy current generated with the generation of the gradient magnetic field interferes with imaging, an actively shielded gradient coil (ASGC) with a purpose of reduction of the eddy current may be used as the gradient magnetic field coil 11, for example. The ASGC is a gradient magnetic field coil in which a shield coil for minimizing effect of leakage current is provided on an outer side of a main coil for forming gradient magnetic fields in the X-axis, Y-axis, and Z-axis directions.

The WB coil 12 is installed in a shape which is substantially cylindrical so as to surround the patient U on an inner side of the gradient magnetic field coil 11. The WB coil 12 functions as a transmission coil. That is, the WB coil 12 transmits an RF pulse toward the patient U according to an RF pulse signal transmitted from the RF transmitter 32. On the other hand, the WB coil 12 may function as a reception coil in addition to function as the transmission coil. In this case, the WB coil 12 receives an MR signal emitted from the patient U by excitation of a nucleus.

The MRI apparatus 1 may include a local coil 20 as shown in FIG. 1 in addition to the WB coil 12. The local coil 20 is placed in the vicinity of a body surface of the patient U. The local coil 20 may include coil elements. These coil elements are arranged on an array and inside the local coil 20, and are called PAC (Phased Array Coil) in some cases.

The local coil 20 has several types. For example, the local coil 20 has types such as a body coil installed at a chest part, a belly part or a leg part of the patient U as shown in FIG. 1, and a spine coil installed on a back side of the patient U and the like. Besides, the local coil 20 has types such as a head coil for imaging a head part of the patient U and a foot coil for imaging a foot and the like. Moreover, the local coil 20 has types such as a wrist coil for imaging a wrist, a knee coil for imaging a knee, a shoulder coil for imaging a shoulder and the like.

The local coil 20 functions as the reception coil. That is, the local coil 20 receives the afore-mentioned MR signal. However, the local coil 20 may be a transmission and reception coil having the function as the transmission coil for transmitting the RF pulse in addition to the function as the reception coil for receiving the MR signal. For example, in the head coil and the knee coil as the local coil 20, there is also the transmission and reception coil. That is, the type of the local coil 20 may be any type of transmission only, reception only, or transmission and reception.

The gradient magnetic field power supply 31 includes the gradient magnetic field power supply devices 31$x$, 31$y$, and 31$z$ for each channel for driving each of the coils generating the gradient magnetic fields of the X-axis, the Y-axis, and the Z-axis. The gradient magnetic field power supply devices 31$x$, 31$y$, and 31$z$ independently output required current waveforms to each channel in accordance with an instruction of a sequence controller. As a result, the gradient magnetic field coil 11 can apply gradient magnetic fields in the X-axis, Y-axis, and Z-axis directions to the patient U.

The RF transmitter 32 generates an RF pulse signal based on an instruction from the sequence controller 34. The RF transmitter 32 transmits the generated RF pulse signal to the WB coil 12.

The MR signal received by the local coil 20 or more specifically, the MR signal received by each of the coil elements in the local coil 20 is transmitted to the RF receiver 33. An output line of each coil element and an output line of WB coil 12 are called "channel". Therefore, each of the coil elements and each MR signal output from the WB coil 12 may be referred to as a channel signal. The channel signal received by the WB coil 12 is also transmitted to the RF receiver 33.

The RF receiver 33 analog-to-digital (AD)-converts the received channel signal, that is, MR signal, and outputs it to the sequence controller 34. The MR signal which has been converted into a digital one is also called "raw data" in some cases.

The sequence controller 34 images the patient U by driving the gradient magnetic field power supply 31, the RF transmitter 32, and the RF receiver 33, on the basis of control by the console 400. The sequence controller 34 transmits, when the raw data is received from the RF receiver 33 by imaging, the raw data to the console 400.

The sequence controller 34 includes processing circuitry (not shown). This processing circuitry is constituted by a processor for executing a predetermined program and hardware such as a field programmable gate array (FPGA), an application specific integrated circuit (ASIC) and the like, for example.

The console 400 includes the processing circuitry 40, the memory 41, the display 42, and the input interface 43.

The processing circuitry 40 means any one of dedicated or general central processing unit (CPU) and a micro-processor unit (MPU), an application specific integrated circuit (ASIC), and a programmable logic device. The programmable logic device may be, for example, any one of a simple programmable logic device (SPLD), a complex programmable logic device (CPLD), a field programmable gate array (FPGA) and the like. The processing circuitry 40 reads programs stored in the memory 41 or directly implemented in the processing circuitry 40, executes these programs, and controls the operation of the sequence controller 34 to execute imaging according to the pulse sequence, thereby achieving a function of generating an MR image.

The processing circuitry 40 may be a single processing circuit or a combination of multiple processing circuit elements. In the latter case, the memory 41 includes multiple memory elements each storing an element of a program, each of the multiple memory elements is provided for each of the multiple processing circuit elements. Alternatively, the memory 41 includes a single memory storing the program, the single memory is provided for the multiple processing circuit elements.

The memory 41 is made up of semiconductor memory devices such as a random access memory (RAM) and a flash memory, hard discs, optical discs, and the like. The memory 41 may be made up of a portable media such as a universal serial bus (USB) memory and a digital video disk (DVD). The memory 41 stores various processing programs (including application programs, as well as an operating system (OS)) used in the processing circuitry 40, data necessary for executing the programs, and image data. Moreover, the OS may include a graphic user interface (GUI) which frequently uses graphics for displaying information for the operator on the display 42, and allows basic operations to be performed by use of the input interface 43.

The display 42 is a display device such as a liquid crystal display panel, a plasma display panel, and an organic electro luminescence (EL) panel.

The input interface 43 includes an input device which can be operated by the operator, and an input circuit for inputting a signal from the input device. The input device includes a pointing device (for example, a mouse), a keyboard, various buttons, and the like. When the input device is operated by the operator, the input circuit generates a signal corresponding to the operation and outputs it to the processing circuitry 40. It should be noted that the MRI apparatus 1 may include a touch panel in which the input device is integrated with the display 42.

Under the control of the processing circuitry 40, the console 400 acquires MR signals transmitted from the sequence controller 34, and stores the acquired MR signals in the memory 41. Under the control of the processing circuitry 40, the console 400 performs post-processing, that is, reconstruction processing such as Fourier transform on the MR signals stored in the memory 41, thereby generating a desired MR image in the patient U. The console 400 stores the generated various MR images in the memory 41 under the control of the processing circuitry 40.

The bed 500 includes a bed body 50 and a table 51. The bed body 50 supports the table 51 to move the table 51, for example, in the X-axis direction, the Y-axis direction, and the Z-axis direction. The movement of the table 51 in the X-axis direction is a movement in a lateral direction of the patient U, that is, in a short-side direction of the table 51. The movement of the table 51 in the Y-axis direction is a movement in a vertical direction of the table 51, that is, in a thickness direction of the table 51. The movement of the table 51 in the Z-axis direction is a movement in a front-rear direction of the table 51, that is, in a longitudinal direction of the table 51.

Figure 2:
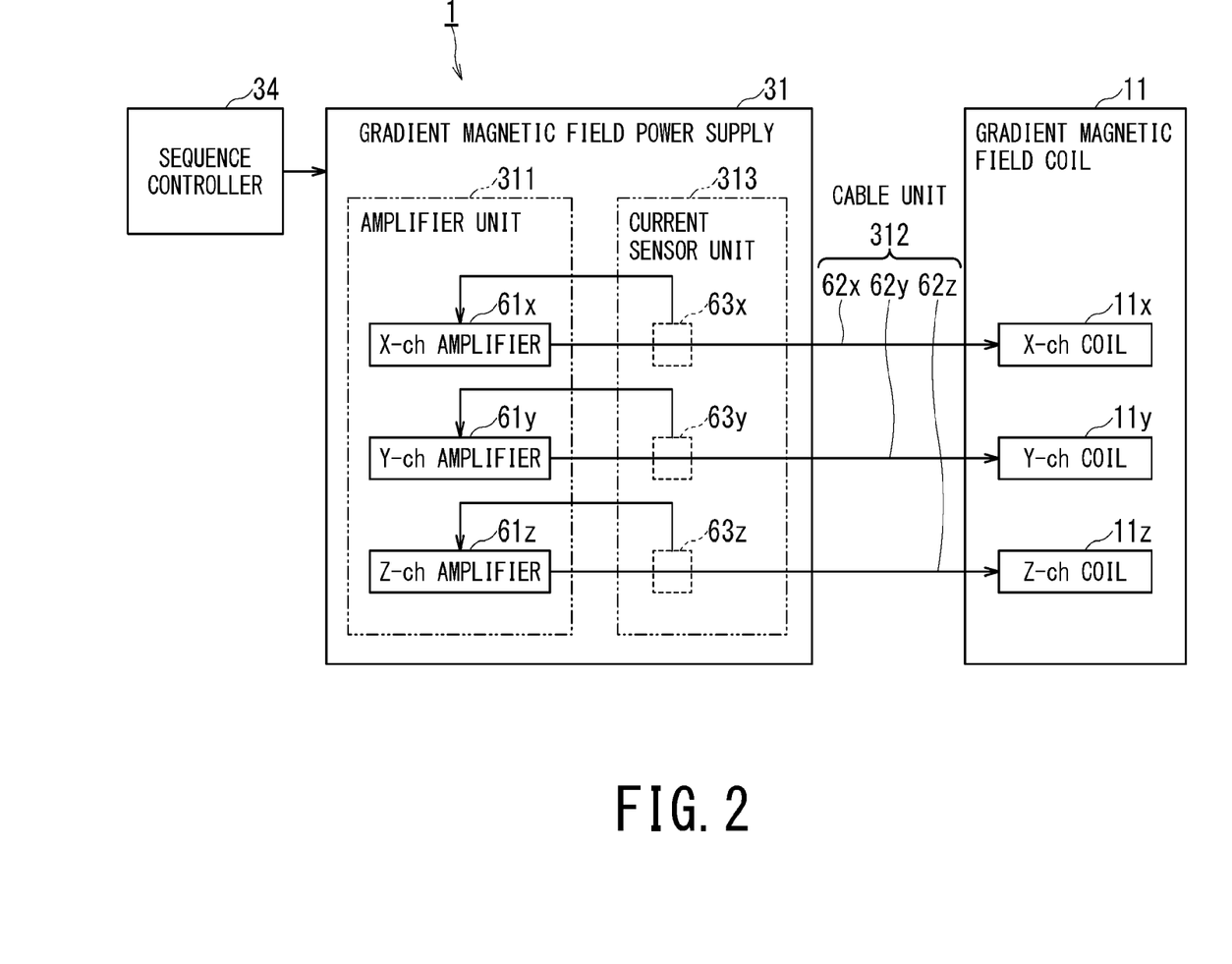
FIG. 2 is a block diagram showing a configuration of a gradient magnetic field power supply provided in the MRI apparatus according to an embodiment.

FIG. 2 is a block diagram showing a configuration of the gradient magnetic field power supply 31 provided in the MRI apparatus 1.

FIG. 2 shows a gradient magnetic field power supply 31, a sequence controller 34 for controlling the gradient magnetic field power supply 31, and a gradient magnetic field coil 11 for applying a gradient magnetic field to the patient U by a current supplied from the gradient magnetic field power supply 31. The gradient magnetic field coil 11 includes an X-ch coil 11x for generating a gradient magnetic field in the X-axis direction, a Y-ch coil 11y for generating a gradient magnetic field in the Y-axis direction, and a Z-ch coil 11z for generating a gradient magnetic field in the Z-axis direction.

The gradient magnetic field power supply 31 includes an amplifier unit 311, a cable unit 312, and a current sensor unit 313, and is configured to supply a current to the gradient magnetic field coil 11 as a load.

The amplifier unit 311 includes an X-ch amplifier 61x, a Y-ch amplifier 61y, and a Z-ch amplifier 61z corresponding to the X-ch coil 11x, the Y-ch coil 11y, and the Z-ch coil 11z, respectively. The X-ch amplifier 61x boosts and smoothes the three-phase AC voltage connected to the three-phase AC power supply to a DC voltage of 2000 V, for example. The amplifiers 61y and 61z also function in the same manner as the X-ch amplifier 61x.

The cable unit 312 includes an X-ch cable 62x, a Y-ch cable 62y, and a Z-ch cable 62z corresponding to the X-ch coil 11x, the Y-ch coil 11y, and the Z-ch coil 11z, respectively. The X-ch cable 62x supplies the power boosted by the X-ch amplifier 61x to the X-ch coil 11x. The cables 62y and 62z also function in the same manner as the X-ch cable 62x.

The current sensor unit 313 includes an X-ch current sensor 63x, a Y-ch current sensor 63y, and a Z-ch current sensor 63z corresponding to the X-ch coil 11x, the Y-ch coil 11y, and the Z-ch coil 11z, respectively. The X-ch current sensor 63x measures a current value flowing through a part of the X-ch cable 62x. The current sensors 63y and 63z also function in the same manner as the X-ch current sensor 63x.

Each of the current sensors 63x, 63y and 63z is, for example, a Hall element type current sensor. The Hall element type current sensor measures a current value by converting the magnetic flux generated around the measurement current flowing in the direction of the normal vector (body axis thereof) of the sensor into a voltage using the Hall effect. It should be noted that each of the current sensors 63x, 63y and 63z is not limited to the Hall element type current sensor. For example, each of the current sensors 63x, 63y and 63z may be a current sensor in which a Hall element type and a current transformer (CT) type are combined. In the CT type, a principle that a measured current is converted into a secondary current corresponding to the winding ratio is adopted.

In this embodiment, the X-ch amplifier 61x inputs an input signal (command current) from the sequence controller 34 and an error signal (measured current) which is the output of the current sensor 63x, thereby performing pulse width modulation control so that a difference between their signals is zero. The amplifiers 61y and 61z also function in the same manner as the X-ch amplifier 61x.

Figure 3:
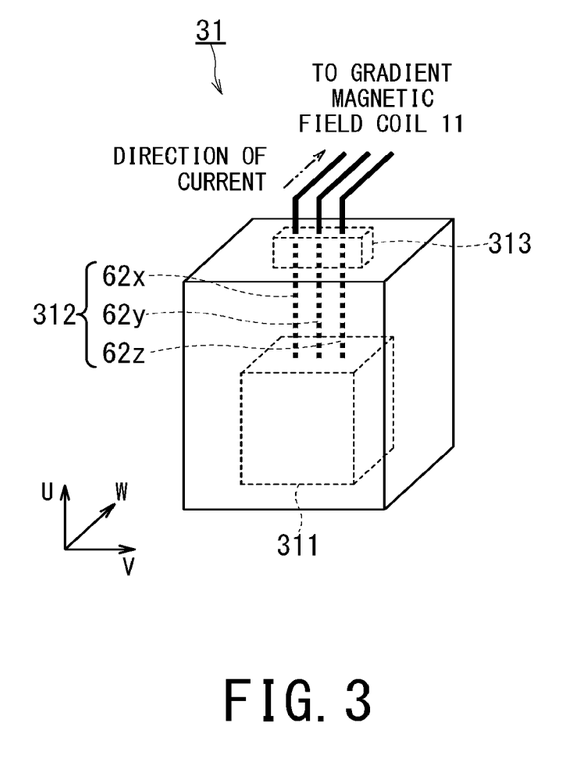
FIG. 3 is a schematic diagram showing a structural example of the gradient magnetic field power supply provided in the MRI apparatus according to the embodiment.

FIG. 3 is a schematic diagram showing a structural example of the gradient magnetic field power supply 31 provided in the MRI apparatus 1.

FIG. 3 shows a schematic structure of the gradient magnetic field power supply 31 arranged in the UVW coordinate system distinguished from the XYZ coordinate system shown in FIG. 1. The gradient magnetic field power supply 31 includes an amplifier unit 311, a cable unit 312, and a current sensor unit 313. The cable unit 312 is connected to the amplifier unit 311 at an upper part of the amplifier unit 311 arranged at a lower part of a housing of the gradient magnetic field power supply 31. The cable unit 312 connected to the amplifier unit 311 extends upward (in a positive direction of the U-axis directions) and is drawn out from the upper part of the housing of the gradient magnetic field power supply 31. The cables 62x, 62y and 62z of the cable unit 312 drawn out from the upper part of the housing of the gradient magnetic field power supply 31 are connected to the respective coils of the gradient magnetic field coil 11. The current sensor unit 313 is installed in a part of the cable unit 312.

It should be noted that the cable unit 312 is not limited to the case where the cable unit 312 extends upward and is drawn out from the upper part of the housing of the gradient magnetic field power supply 31. For example, the cable unit 312 may be connected to the amplifier unit 311 at a side of the amplifier unit 311. In this case, the cable unit 312 extends laterally (for example, in a positive direction of the W-axis directions) and is drawn out from the side part of the housing of the gradient magnetic field power supply 31.

Subsequently, an arrangement of each current sensor in the current sensor unit 313 will be described with reference to FIGS. 4 and 5.

Figure 4:
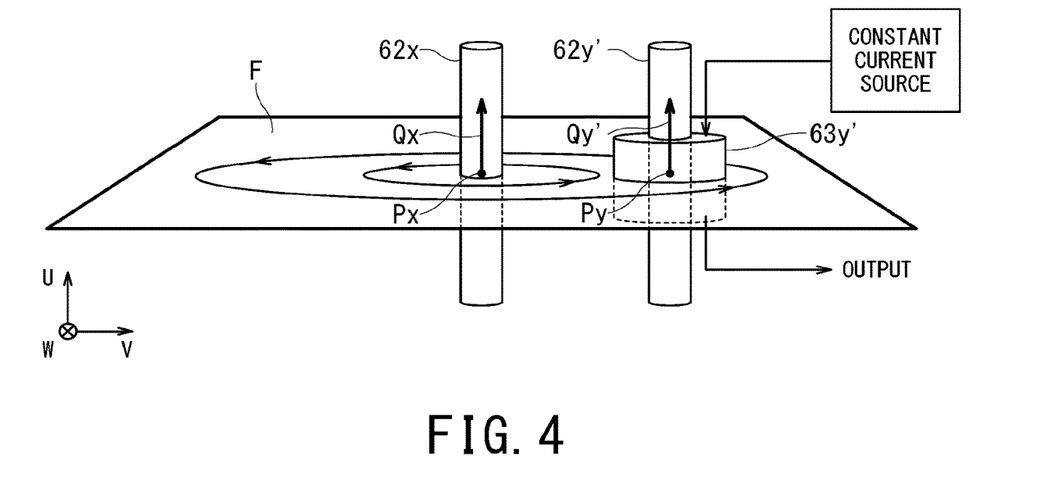
FIG. 4 is a diagram for explaining a principle for determining an arrangement of each current sensor provided in the MRI apparatus according to the embodiment.

FIG. 4 is a diagram for explaining a principle for determining an arrangement of each current sensor provided in the MRI apparatus 1.

FIG. 4 shows the X-ch cable 62x and the Y-ch cable 62y' installed so as to be adjacent to each other and substantially parallel. A direction Qx of a current flowing through the position Px of the X-ch cable 62x is a positive direction of the U-axis directions. In this case, as shown in FIG. 4, a magnetic flux is generated on an orthogonal plane (VW plane) F of the direction Qx of the current by the current at the position Px.

Further, FIG. 4 shows a current sensor 63y' for measuring a current value flowing through the position Py on the orthogonal plane F. The current sensor 63y' is installed such that a direction of a normal vector thereof substantially coincides with a direction of the Y-ch cable 62y', that is, a direction of a current Qy'. With such arrangement of the Y-ch cable 62y', it is possible for the current sensor 63y' to measure the current value flowing at the position Py of the Y-ch cable 62y'. It should be noted that the length of the term "vector" of the present embodiment is not limited.

However, when a position of the current sensor 63y' for measuring the current value flowing through the Y-ch cable 62y' is close to a position of the X-ch cable 62x, the current sensor 63y' also detects the magnetic flux generated by the current flowing through a position Px of the X-ch cable 62x. As a result, it is unintentionally measured as the current of the Y-ch cable 62y'. For this reason, the crosstalk between the cables 62x and 62y' increases, and the output accuracy of the gradient magnetic field power supply 31 deteriorates.

The increase in crosstalk between the cables 62x and 62y', that is, between the plurality of cables affects the pulse width modulation (PWM) control by the gradient magnetic field power supply 31. In such a case, the output current to the gradient magnetic field coil of the gradient magnetic field power supply is underestimated by the pulse width modulation, so that the output current is controlled to be larger than the set value. Alternatively, the output current is over-evaluated, so that the output current is controlled to be smaller than the set value. In the former case, (1) the amount of magnetic flux generated in the imaging area due to the output current of the gradient magnetic field power supply is larger than the predetermined amount, causing deterioration of the MR image, and (2) it is difficult to secure a sufficient distance between a plurality of cables because the size of the electric parts around the current sensor is large. In the latter case, due to the output current of the gradient magnetic field power supply, the amount of magnetic flux in the imaging region is smaller than the predetermined amount, thereby resulting in deterioration of the image.

Therefore, in the gradient magnetic field power supply 31, a second current sensor is provided so that its direction crosses the direction of the current flowing to the corresponding position on a first cable adjacent to the second cable. That is, the second current censer is provided such that a normal vector according to a position and a direction of the second current sensor is not parallel, in a 3D-space, to a current vector according to a corresponding position of the first cable and to a direction of a current at the corresponding position. Referring to FIG. 5, the corresponding position of the first cable is the position Px on the X-ch cable 62x intersecting the orthogonal plane F of the normal vector formed by the position Py of the Y-ch sensor 63y and the direction Qy'.

Specifically, the second current sensor is provided such that the normal vector is provided, when the normal vector exists on a same plane as the current vector of the first cable, so as to be non-parallel to the current vector (Arrangement example 1). Alternatively, the second current sensor is provided such that the normal vector is provided so as not to be a same plane as the current vector, that is, so as to be arranged in a position twisted from the current vector (Arrangement example 2). With such configurations, the crosstalk between the first cable and the second cable is suppressed.

Figure 6:
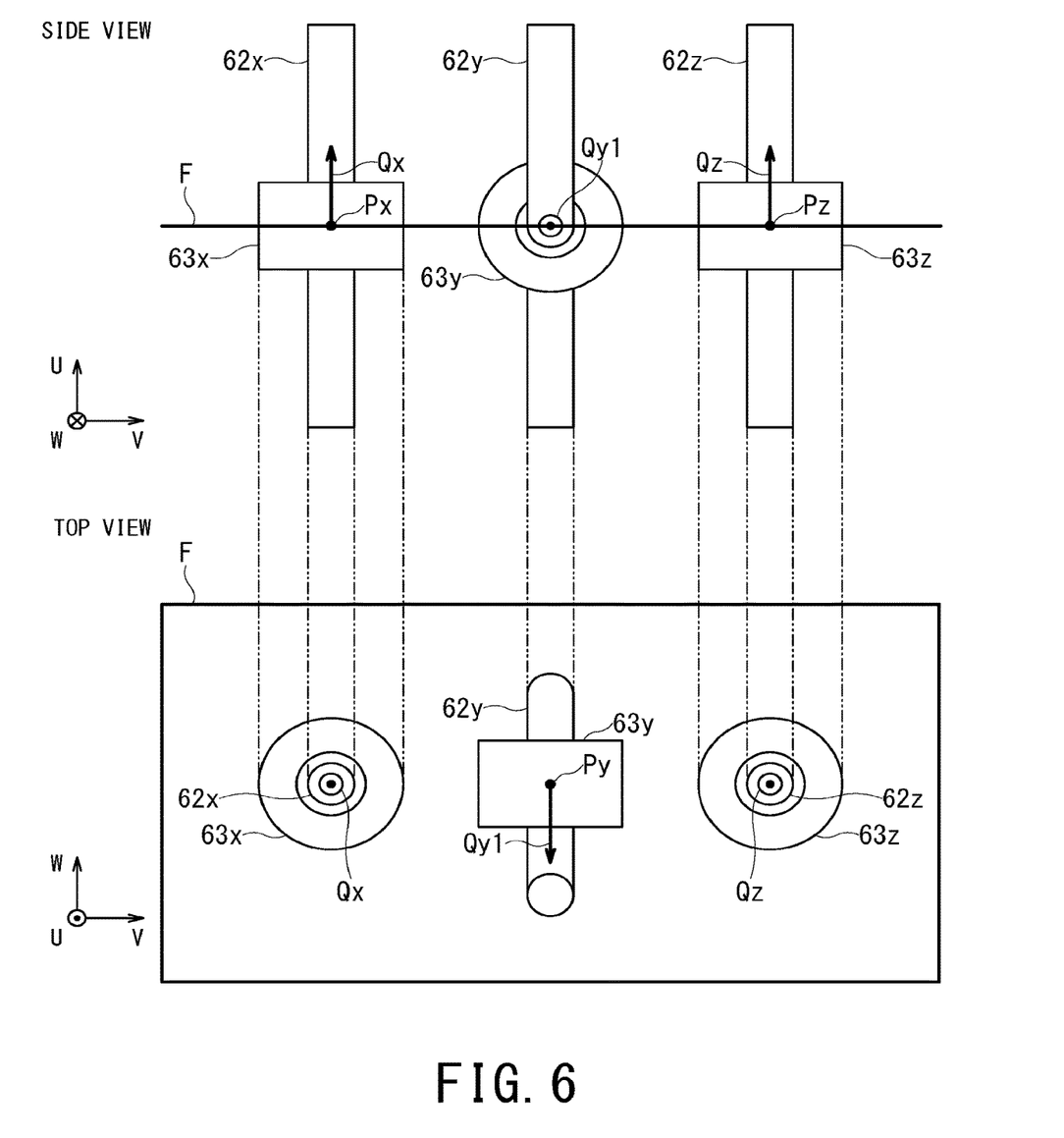
FIG. 6 is a diagram showing a first installation example of each current sensor provided in the MRI apparatus according to the embodiment.
Figure 7:
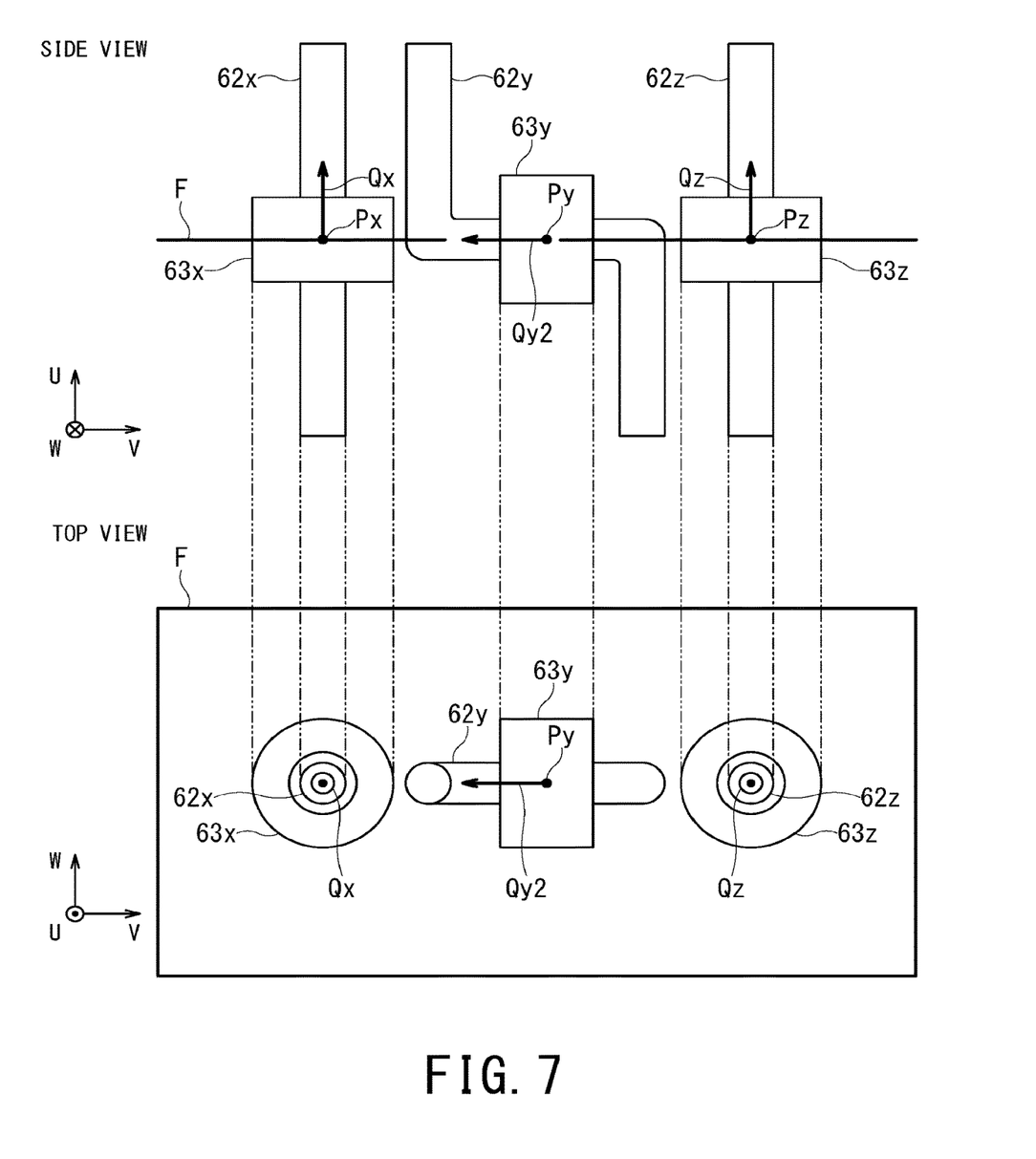
FIG. 7 is a diagram showing a second installation example of each current sensor provided in the MRI apparatus according to the embodiment.
Figure 8:
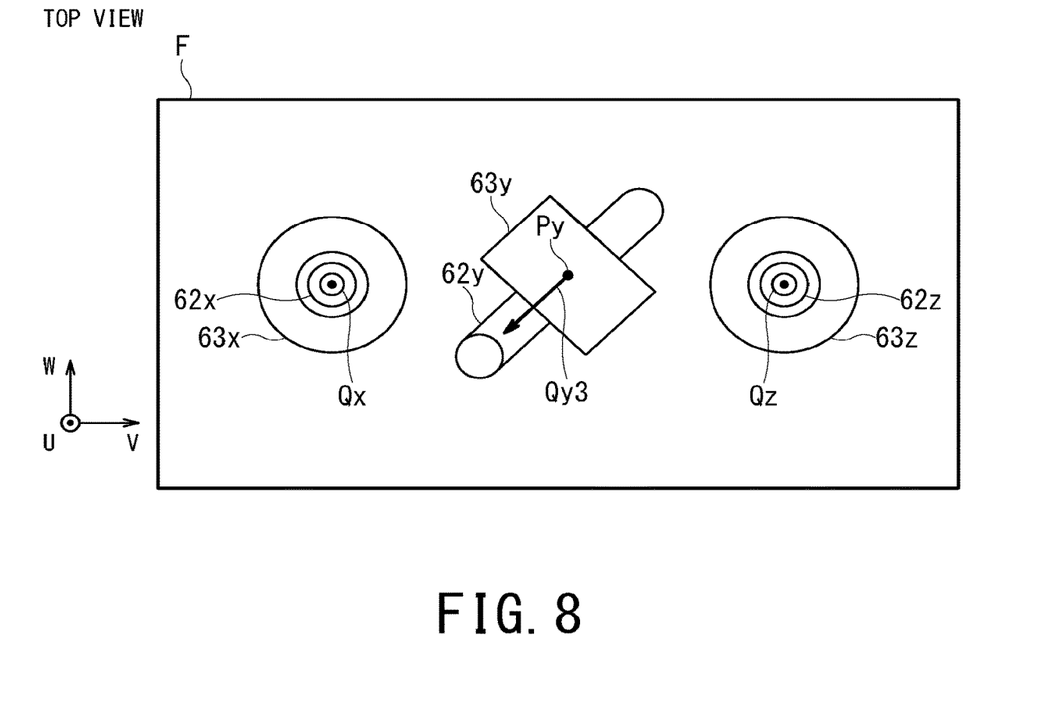
FIG. 8 is a diagram showing a third installation example of each current sensor provided in the MRI apparatus according to the embodiment.
Figure 9:
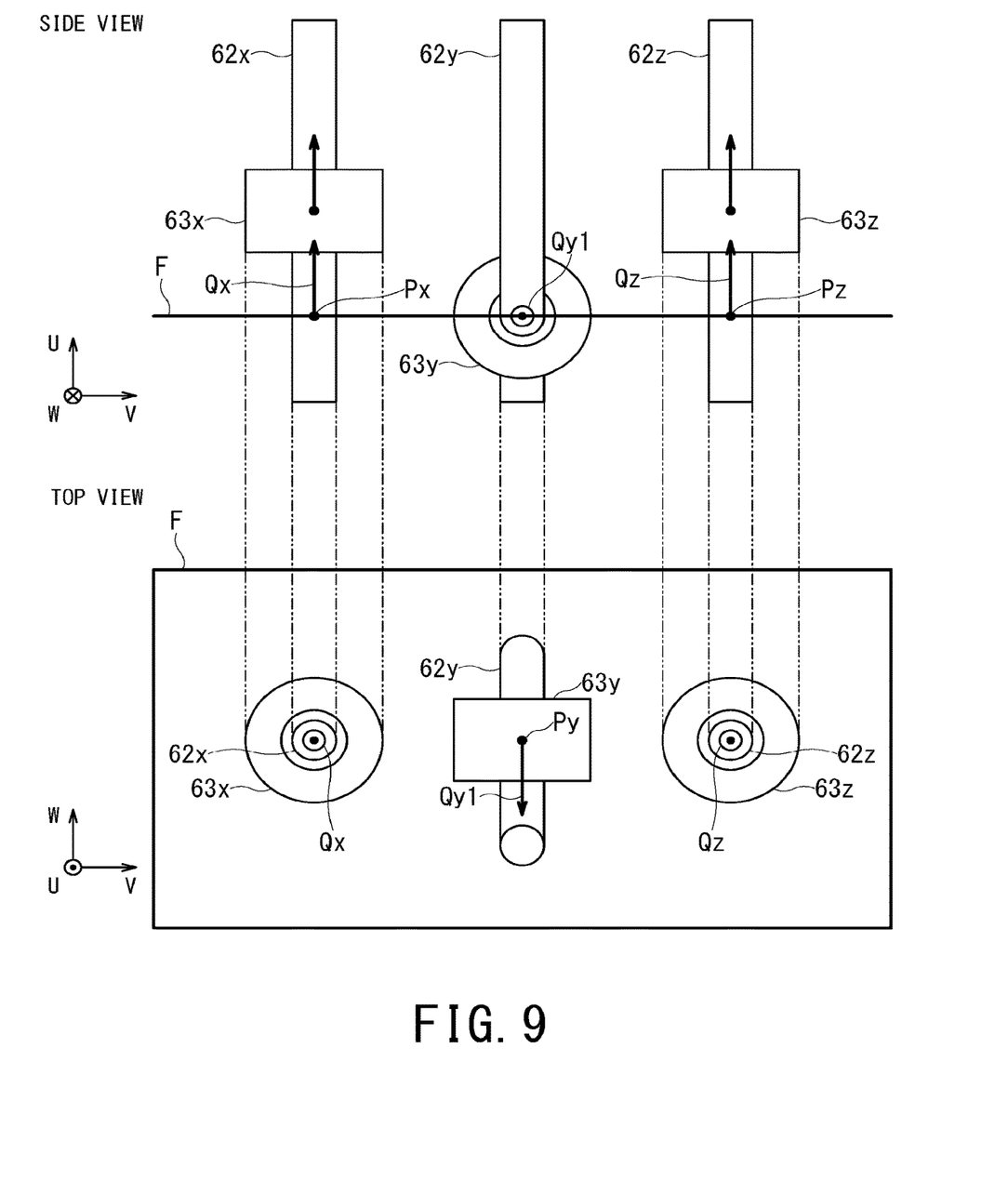
FIG. 9 is a diagram showing a fourth installation example of each current sensor provided in the MRI apparatus according to the embodiment.

An example of the second sensor according to the above arrangement example 1 is shown in FIG. 7 described later. In FIG. 7, the direction of the second current sensor is substantially orthogonal to the direction of the current vector. The substantially orthogonal includes, in addition to orthogonal, within the range of alignment error with reference to orthogonality. An example of the second sensor according to the above placement example 1 is shown in FIGS. 6, 8, and 9 to be described later.

That is, the gradient magnetic field power supply 31 installs a second current sensor for measuring a current value flowing through the second cable on an orthogonal plane of a direction of a current flowing through the first cable adjacent to the second cable, the installed position being in the second cable. With such an optimum configuration, the crosstalk between the first and second cables is largely suppressed. In this embodiment, at least one current sensor out of the current sensors 63x, 63y, and 63z shown in FIG. 2 can be used as the second current sensor and the remaining current sensors can be used as the first current sensor. Hereinafter, a case where only the Y-ch current sensor 63y among the current sensors 63x, 63y, and 63z shown in FIG. 2 is used as the second current sensor will be described.

Figure 5:
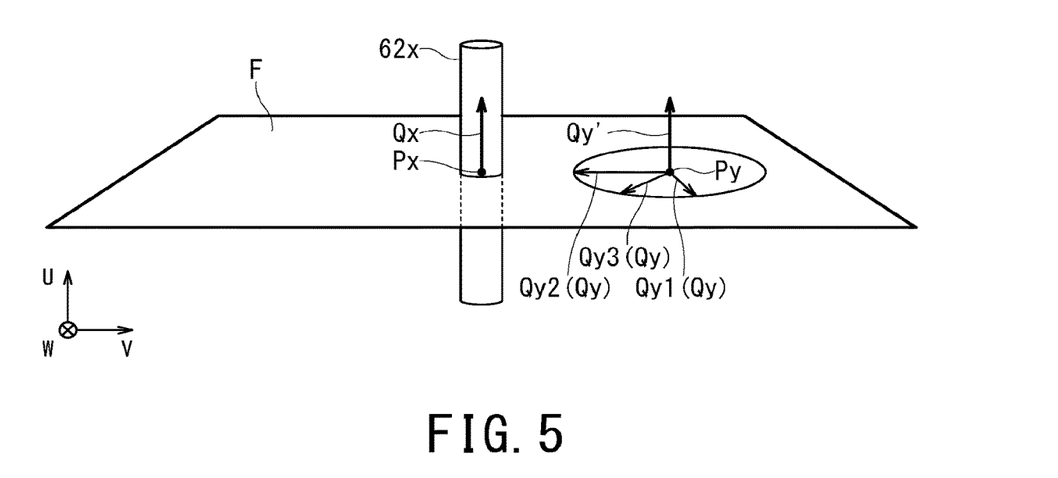
FIG. 5 is a diagram for explaining a method for determining the arrangement of each current sensor provided in the MRI apparatus according to the embodiment.

FIG. 5 is a diagram for explaining a method for determining the arrangement of each current sensor provided in the MRI apparatus 1.

FIG. 5 shows the direction Qy of the current flowing through the position Py, which is determined in relation to the X-ch cable 62x. The direction Qy of the current at the position Py to be measured is determined so that the Y-ch current sensor 63y (shown in FIG. 2) does not detect the magnetic flux (shown in FIG. 4) on the orthogonal plane F in relation to the X-ch cable 62x. As shown in FIG. 5, the direction Qy of the current at the position Py is determined so as to spread radially on the orthogonal plane F centered on the position Py. The Y-ch current sensor 63y is installed so that the direction of the normal vector substantially coincides with the current direction Qy at the position Py on the orthogonal plane F.

Subsequently, an arrangement example of the Y-ch current sensor 63y in the case where a negative direction Qy1 of the W-axis directions is adopted as the current direction Qy shown in FIG. 5 will be described with reference to FIG. 6. An arrangement example of the Y-ch current sensor 63y in the case where the negative direction Qy2 of the V-axis directions is adopted as the current direction Qy shown in FIG. 5 will be described with reference to FIG. 7. An arrangement example of the Y-ch current sensor 63y in the case where an oblique direction Qy3, formed between the negative direction of the W-axis directions and the negative direction of the W-axis directions is adopted as the current direction Qy shown in FIG. 5 will be described with reference to FIG. 8.

FIG. 6 is a diagram showing a first installation example of each current sensor provided in the MRI apparatus 1.

The upper part of FIG. 6 shows any one of side views of the first installation example of the current sensors 63x, 63y, and 63z. The lower part of FIG. 6 shows a top view of a first installation example of the current sensors 63x, 63y, and 63z.

The Y-ch cable 62y is adjacent to both of the X-ch cable 62x and the Z-ch cable 62z. In this embodiment, "adjacent" means within a distance that it is possible for the current sensor to detect more than a certain amount of magnetic flux generated by the current flowing through the adjacent cable.

The cables 62x and 62z are arranged substantially parallel to the U-axis direction. The X-ch current sensor 63x is installed on the X-ch cable 62x so as to measure the current value of the positive direction Qx of the U-axis directions. The direction of the normal vector of the X-ch current sensor 63x substantially coincides with the direction of the X-ch cable 62x. The Z-ch current sensor 63z is installed in the Z-ch cable 62z so as to measure the current value of the positive direction Qz of the U-axis directions. The direction of the normal vector of the Z-ch current sensor 63z substantially coincides with the direction of the Z-ch cable 62z.

As shown in FIG. 6, the Y-ch cable 62y has a structure in which a part of the Y-ch cable 62y is bent so that the current is on the orthogonal plane F of the current direction Qx at the position Px so that the current is in the negative direction Qy1 of the W-axis directions. The Y-ch current sensor 63y is installed in a portion along the orthogonal plane F of the entire Y-ch cable 62y in such a direction as to measure the current value flowing at the position Py and along the negative direction Qy1 of the W-axis directions. The direction of the normal vector of the Y-ch current sensor 63y substantially coincides with the direction of the portion along the orthogonal plane F of the entire Y-ch cable 62y. That is, the Y-ch current sensor 63y does not detect the magnetic flux generated by the current flowing in the same plane positions Px and Pz because of the direction thereof.

According to the first installation example of the current sensors 63x, 63y, and 63z as shown in FIG. 6, the current sensor 63y with a direction determined by the direction of the measured current Qy1 does not detect the magnetic flux generated by the current flowing through the cables 62x and 62z. That is, the current sensor 63y can measure only the current flowing through the Y-ch cable 62y. Likewise, the current sensors 63x and 63z are not affected by the magnetic flux generated by the current flowing through the Y-ch cable 62y. It should be noted that the current sensor 63x shown in FIG. 6 may be affected by a small magnetic flux generated by the current flowing at the position Pz according to the distance to the Z-ch cable 62z. The current sensor 63z may be affected by a small magnetic flux generated by the current flowing at the position Px according to the distance to the X-ch cable 62x.

FIG. 7 is a diagram showing a second installation example of each current sensor provided in the MRI apparatus 1.

The upper part of FIG. 7 shows any one of side views of the second installation example of the current sensors 63x, 63y, and 63z. The lower part of FIG. 7 shows a top view of a second installation example of the current sensors 63x, 63y, and 63z.

The Y-ch cable 62y is adjacent to both of the X-ch cable 62x and the Z-ch cable 62z.

The cables 62x and 62z are arranged substantially parallel to the U-axis direction. The X-ch current sensor 63x is installed on the X-ch cable 62x so as to measure the current value of the positive direction Qx of the U-axis directions. The direction of the normal vector of the X-ch current sensor 63x substantially coincides with the direction of the X-ch cable 62x. The Z-ch current sensor 63z is installed in the Z-ch cable 62z so as to measure the current value of the positive direction Qz of the U-axis directions. The direction of the normal vector of the Z-ch current sensor 63z substantially coincides with the direction of the Z-ch cable 62z.

As shown in FIG. 7, the Y-ch cable 62y has a structure in which a part of the Y-ch cable 62y is bent so that the current is on the orthogonal plane F of the current direction Qx at the position Px so that the current is in the negative direction Qy2 of the V-axis directions. The Y-ch current sensor 63y is installed in a portion along the orthogonal plane F of the entire Y-ch cable 62y so as to measure the current value flowing at the position Py and along the negative direction Qy2 of the V-axis directions. The direction of the normal vector of the Y-ch current sensor 63y substantially coincides with the direction of the portion along the orthogonal plane F of the entire Y-ch cable 62y. That is, the Y-ch current sensor 63y does not detect the magnetic flux generated by the current flowing in the same plane positions Px and Pz because of the direction thereof.

According to the second installation example of the current sensors 63x, 63y, and 63z as shown in FIG. 7, the current sensor 63y with a direction determined by the direction of the measured current Qy2 is connected to the cables 62x, 62z does not detect the magnetic flux generated by the current flowing through the coil. That is, it is possible for the current sensor 63y to measure only the current flowing through the Y-ch cable 62y. Likewise, the current sensors 63x and 63z are not affected by the magnetic flux generated by the current flowing through the Y-ch cable 62y. It should be noted that the current sensor 63x shown in FIG. 7 may be affected by a small magnetic flux generated by the current flowing at the position Pz according to the distance to the Z-ch cable 62z. The current sensor 63z may be affected by a small magnetic flux generated by the current flowing at the position Px according to the distance to the X-ch cable 62x.

According to the viewpoint of installation space, the first installation example shown in FIG. 6 is more advantageous than the second installation example shown in FIG. 7.

FIG. 8 is a diagram showing a third installation example of each current sensor provided in the MRI apparatus 1. Any one of side views of the third installation example of the current sensors 63x, 63y, and 63z will be omitted.

FIG. 8 shows a top view of a third installation example of the current sensors 63x, 63y, and 63z. The Y-ch cable 62y is adjacent to both of the X-ch cable 62x and the Z-ch cable 62z.

Since the arrangement of the cables 62x and 62z and the installation of the current sensors 63x and 63z are the same as those shown in FIGS. 6 and 7, the description thereof will be omitted.

As shown in FIG. 8, the Y-ch cable 62y has a structure in which a part of the Y-ch cable 62y is bent so that the current is on the orthogonal plane F of the current direction Qx at the position Px so that the current is in the oblique direction Qy3, formed between the negative direction of the W-axis directions and the negative direction of the V-axis directions. The Y-ch current sensor 63y is installed in a portion along the orthogonal plane F of the entire Y-ch cable 62y in such a manner as to measure the current value flowing at the position Py and along the oblique direction Qy3, formed between the negative direction of the W-axis directions and the negative direction of the V-axis direction. The direction of the normal vector of the Y-ch current sensor 63y substantially coincides with the direction of the portion along the orthogonal plane F of the entire Y-ch cable 62y. That is, the Y-ch current sensor 63y does not detect the magnetic flux generated by the current flowing in the same plane positions Px and Pz because the direction thereof.

According to the third installation example of the current sensors 63x, 63y, and 63z as shown in FIG. 8, the current sensor 63y with a direction determined by the oblique direction Qy3 of the measured current does not detect the magnetic flux generated by the current flowing through the cables 62x and 62z as in the first and second installation examples described above. That is, it is possible for the current sensor 63y to measure only the current flowing through the Y-ch cable 62y. Likewise, the current sensors 63x and 63z are not affected by the magnetic flux generated by the current flowing through the Y-ch cable 62y.

With reference to FIGS. 6 to 8, examples in which the current sensors 63x, 63y, and 63z are installed so as to measure current values on the same plane (orthogonal plane F) have been described. However, it is not limited to that case. The Y-ch current sensor 63y may be installed, as shown in FIG. 9, on the orthogonal plane of the direction of the current at a position other than the position measured by the X-ch current sensor 63x, the installed position being a portion of the Y-ch cable 62y.

FIG. 9 is a diagram showing a fourth installation example of each current sensor provided in the MRI apparatus 1.

The upper part of FIG. 9 shows any one of side views of a fourth installation example of the current sensors 63x, 63y, and 63z. The lower part of FIG. 9 shows a top view of a fourth installation example of the current sensors 63x, 63y, and 63z.

The Y-ch cable 62y is adjacent to both of the X-ch cable 62x and the Z-ch cable 62z.

The cables 62x and 62z are arranged substantially parallel to the U-axis direction. The X-ch current sensor 63x is installed in the X-ch cable 62x so as to measure the current value in the positive direction of the U-axis directions. The direction of the normal vector of the X-ch current sensor 63x substantially coincides with the direction of the X-ch cable 62x. The Z-ch current sensor 63z is installed on the Z-ch cable 62z so as to measure the current value of the positive direction of the U-axis directions. The direction of the normal vector of the Z-ch current sensor 63z substantially coincides with the direction of the Z-ch cable 62z.

As shown in FIG. 9, the Y-ch cable 62y has a structure in which a part of the Y-ch cable 62y is bent so that the current is on the orthogonal plane F of the current direction Qx at the position Px so that the current is in the negative direction Qy1 of the W-axis directions. The Y-ch current sensor 63y is installed in a portion along the orthogonal plane F of the entire Y-ch cable 62y so as to measure the current value flowing at the position Py and along the negative direction Qy1 of the W-axis directions. The direction of the normal vector of the Y-ch current sensor 63y substantially coincides with the direction of the portion along the orthogonal plane F of the entire Y-ch cable 62y. That is, the Y-ch current sensor 63y does not detect the magnetic flux generated by the current flowing in the same plane positions Px and Pz because of the direction thereof.

According to the fourth installation example of the current sensors 63x, 63y, and 63z as shown in FIG. 9, the current sensor 63y with a direction determined by the direction Qy1 of the measured current does not detect the magnetic flux generated by the current flowing through the cables 62x and 62z, as shown in the first installation example described above. That is, it is possible for the current sensor 63y to measure only the current flowing through the Y-ch cable 62y. Similarly, the current sensors 63x and 63z are not affected by the magnetic flux generated by the current flowing through the Y-ch cable 62y. It should be noted that the current sensor 63x shown in FIG. 9 may be affected by a small magnetic flux generated by the current flowing at the position Pz according to the distance to the Z-ch cable 62z. The current sensor 63z may be affected by a small magnetic flux generated by the current flowing at the position Px according to the distance to the X-ch cable 62x.

According to the viewpoint of installation space, the first installation example shown in FIG. 6 is more advantageous than the fourth installation example shown in FIG. 9.

As described above, the Y-ch current sensor 63y has been described as being provided such that its direction crosses the direction of the current flowing in the corresponding position Px on the X-ch cable 62x (or the corresponding position Pz on the Z-ch cable 62z), in other words, such that an inner product of vectors indicating the respective directions is not zero. This is almost the same as the Y-ch current sensor 63y is provided so that the direction of the current detectable by the Y-ch current sensor 63y intersects with the direction of the current detectable by the X-ch current sensor 63x. This is because the direction of the Y-ch current sensor 63y may be regarded as coinciding with the direction of the current detectable by the Y-ch current sensor 63y. In addition, it is assumed that the X-ch current sensor 63x is provided at the corresponding position Px on the X-ch cable 62x.

When the Y-ch current sensor 63y is provided so that the direction of the current detectable by the Y-ch current sensor 63y intersects with the direction of the current detectable by the X-ch current sensor 63x, it is preferable that the current sensors 63x, 63y, and 63z are arranged in a substantive coplanar plane (on the orthogonal plane F in FIGS. 6 to 8). The substantive coplanar plane includes exactly same plane and a range of alignment error with reference to the exactly same plane.

However, the X-ch cable 62x is arranged such that the direction thereof, that is, the direction of the current does not substantially change between an upstream side and a downstream side of the position Px. Therefore, when the Y-ch current sensor 63y is provided so that the direction of the current detectable by the Y-ch current sensor 63y intersects with the direction of the current detectable by the X-ch current sensor 63x, as shown in FIG. 9, the current sensor 63x, 63y, and 63z are arranged in the substantive coplanar plane.

According to the installation examples of the current sensors 63x, 63y, and 63z shown in FIGS. 6 to 9, it is possible to suppress the crosstalk between the adjacent cables 62x, 62y, and 62z. Thus, it is possible to improve the output accuracy of the gradient magnetic field power supply.

According to at least one embodiment described above, it is possible to improve the output accuracy of the gradient magnetic field power supply.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A gradient magnetic field power supply connected to a first coil and a second coil for each applying a gradient magnetic field to an object, the power supply comprising:
- a first amplifier and a second amplifier corresponding to the first coil and the second coil, respectively;
- a first cable connecting the first coil and the first amplifier;
- a second cable connecting the second coil and the second amplifier, the second cable being provided adjacent to the first cable, the second cable having a transverse portion disposed in a plane crossing the first cable;
- a first current sensor installed on the first cable and configured to measure a current value flowing through the first cable; and
- a second current sensor installed on the second cable and configured to measure a current value flowing through the transverse portion of the second cable, wherein
- the second current sensor is provided such that a direction of a current in the transverse portion of the second cable detectable by the second current sensor crosses a direction of a current in the first cable detectable by the first current sensor.

2. The gradient magnetic field power supply according to claim 1, wherein the gradient magnetic field power supply includes:
- an X-ch current sensor for measuring a current value flowing through the X-ch cable connected to the X-ch coil of a gradient magnetic field coil;
- a Y-ch current sensor for measuring a current value flowing through the Y-ch cable connected to the Y-ch coil of a gradient magnetic field coil; and
- a Z-ch current sensor for measuring a current value flowing through the Z-ch cable connected to the Z-ch coil of a gradient magnetic field coil, wherein
- at least one of the X-ch current sensor, the Y-ch current sensor and the Z-ch current sensor is the second current sensor, and the remaining current sensor is the first current sensor.

3. The gradient magnetic field power supply according to claim 1, wherein
- the transverse portion of the second cable is disposed in a plane substantially orthogonal to the first cable, and
- the second current sensor is provided such that the direction of the current detectable in the transvers portion by the second current sensor is substantially orthogonal to the direction of the current detectable by the first current sensor.

4. The gradient magnetic field power supply according to claim 1, wherein
- the first current sensor and the second current sensor are arranged in a substantive coplanar plane.

5. The gradient magnetic field power supply according to claim 1, wherein
- each of the first current sensor and the second current sensor is a Hall element type current sensor which converts a magnetic flux generated around a measurement current into a voltage using a Hall effect.

6. A gradient magnetic field power supply connected to a first coil and a second coil for each applying a gradient magnetic field to an object, the power supply comprising:
- a first amplifier and a second amplifier corresponding to the first coil and the second coil, respectively;
- a first cable connecting the first coil and the first amplifier;
- a second cable connecting the second coil and the second amplifier, the second cable being provided adjacent to the first cable and having a transverse portion disposed in a plane crossing the first cable;
- a first current sensor installed on the first cable and configured to measure a current value flowing through the first cable; and
- a second current sensor installed on the second cable and configured to measure a current value flowing through the transverse portion of the second cable, wherein
- the second current sensor is provided such that an orientation direction of the second current sensor crosses a direction of a current flowing through a corresponding position of the first cable.

7. The gradient magnetic field power supply according to claim 6, wherein
- the second current censer is provided such that a normal vector according to a position and a direction of the second current sensor is not parallel, in a 3D space, to a current vector according to a corresponding position of the first cable and a current direction at the corresponding position.

8. The gradient magnetic field power supply according to claim 7, wherein
- the corresponding position of the first cable is a position on an orthogonal plane of the normal vector, and in the first cable.

9. The gradient magnetic field power supply according to claim 7, wherein
- the second current sensor is provided such that the normal vector is provided, when the normal vector exists on a same plane as the current vector, so as to be nonparallel to the current vector, or such that the normal vector is provided so as not to be on a same plane as the current vector.

10. The gradient magnetic field power supply according to claim 9, wherein
- the direction of the second current sensor is, when the normal vector exists on the same plane as the current vector, substantially orthogonal to the direction of the current vector.

11. A magnetic resonance imaging apparatus, comprising:
- a first coil;
- a second coil; and
- a gradient magnetic field power supply connected to a first coil and a second coil for each applying a gradient magnetic field to an object, the gradient magnetic field power supply comprising,
- a first amplifier and a second amplifier corresponding to the first coil and the second coil, respectively;
- a first cable connecting the first coil and the first amplifier,
- a second cable connecting the second coil and the second amplifier, the second cable being provided adjacent to the first cable, the second cable having a transverse portion disposed in a plane crossing the first cable,
- a first current sensor installed on the first cable and configured to measure a current value flowing through the first cable, and
- a second current sensor installed on the second cable and configured to measure a current value flowing through the transverse portion of the second cable, wherein
- the second current sensor is provided such that a direction of a current in the transverse portion of the second cable detectable by the second current sensor crosses a direction of a current in the first cable detectable by the first current sensor.

\* \* \* \* \*